US005629244A

United States Patent [19]
Matsuzaki

[11] Patent Number: 5,629,244
[45] Date of Patent: May 13, 1997

[54] FABRICATION METHOD OF SEMICONDUCTOR ACCELEROMETER

[75] Inventor: Tadahiro Matsuzaki, Tokyo, Japan

[73] Assignee: NEC Corporation, Tokyo, Japan

[21] Appl. No.: 428,483

[22] Filed: Apr. 27, 1995

[30] Foreign Application Priority Data

Apr. 28, 1994 [JP] Japan .................................... 6-090885

[51] Int. Cl.$^6$ .............................. C23F 1/00; C03C 15/00; C03C 25/06; H01L 21/306
[52] U.S. Cl. ................................. 438/52; 438/8; 216/2
[58] Field of Search ............................. 437/64, 65, 66, 437/228 SEN; 156/648.1, 651.1

[56] References Cited

U.S. PATENT DOCUMENTS 4,670,092  6/1987  Motamedi ........................ 437/65

FOREIGN PATENT DOCUMENTS 61-97572    5/1986   Japan .
63-292071  11/1988   Japan .

OTHER PUBLICATIONS

Lynn M. Roylance et al., "A Batch–Fabricated Silicon Accelerometer", *IEEE Electron Devices*, vol. ED–26, No. 12, Dec. 1979, pp. 1911–1917.

*Primary Examiner*—Richard L. Schilling
*Attorney, Agent, or Firm*—Young & Thompson

[57] ABSTRACT

Using a p-type silicon substrate 1 having on its front surface an n-type silicon layer 2 with a thickness of twice or more of the desired thickness for the beam, an electrochemical etching is performed from the rear surface and the etching is stopped at the beam thickness which is twice or more of the desired thickness. Etching for the beam part 8 from the rear surface proceeds along with the etching for the gap part 9 from the front surface, and a desired thickness for the beam can be formed by completing the etching at the timing when the gap part is opened through.

5 Claims, 5 Drawing Sheets

FABRICATION METHOD OF SEMICONDUCTOR ACCELEROMETER

BACKGROUND OF THE INVENTION

1. Field of the Invention

The present invention relates to a method of fabricating a semiconductor acceleration sensor consisting of a supporting part, a beam part and a weight part made of semiconductors used for sensing an acceleration by detecting the deflection of the beam part accompanying the displacement of the weight part.

2. The Description of the Prior Art

A sensor for detecting an acceleration by finding the amount of deflection, due to the acceleration, of a beam part having a weight, from the change in the resistance value or the like has already been known widely, and miniaturization of the acceleration sensor through formation of the sensor using silicon as the semiconductor is being put into practice. As an example of such a semiconductor acceleration sensor, one may mention the device disclosed in a paper entitled "A Batch-Fabricated Silicon Accelerometer", IEEE Electron Devices, Vol. ED-26, No.12, p.1911, December 1979. According to this paper, an acceleration sensor consisting of a supporting part 31, a beam part 32 and a weight part 33 as shown in FIG. 1 can be formed by subjecting a single sheet of silicon substrate to anisotropic etching.

In such a sensor, the shape of the weight part and the beam part directly affects the sensitivity of the sensor, and in particular a high dimensional accuracy is demanded for the thickness of the beam part.

The fabrication process of a semiconductor acceleration sensor according to anisotropic etching is shown in FIGS. 2A to 2D as a first example of the prior art. In this method, first, using thermal oxide films 42 and 43 on a silicon substrate 41 as the etching masks (FIGS. 2A and 2B), the region between a supporting part 44 and a weight part 45 is etched from the rear surface by anisotropic etching (FIG. 2C), then a gap part 46 surrounding the periphery of the weight part is formed by giving the anisotropic etching also from the front surface (FIG. 2D).

As techniques of accomplishing a high precision working of the beam thickness, methods of using a silicon substrate consisting of two crystal layers with different conductivity types, and removing the crystal layer of one conductivity type and using the crystal layer of the other conductivity type as the beam part will be described as a second and third examples of the prior art in the following.

FIGS. 3A to 3F show the fabrication process of a second example of the prior art disclosed in Japanese Laid-Open Patent Publication No. 63-292071. According to this method, first, an n-type silicon substrate 52 is formed on a p-type silicon substrate 51, and a thermal oxide film 53 is formed on both surface of the laminated substrate (FIG. 3A). The thickness of the n-type silicon substrate 52 is the same thickness of a desired beam thickness using the thermal oxide film 53 as the mask, the n-type silicon substrate 52 and a part of the p-type silicon substrate 51 are removed in a V-shaped groove 54 to form a gap part (FIG. 3B). Next, a metallic film 55 for establishing electrical conduction with the n-type silicon substrate 52 is formed on the n-type silicon substrate (FIG. 3C). Next, the p-type silicon part between the supporting part 56 and the weight part 58 is removed by using an electrolytic etching, or electrochemical etching from the p-type silicon substrate 51 side (FIG. 3E). When the etching is reached to the metallic film 55, electrochemical etching is stopped automatically. Thus the thickness of the n-type silicon substrate 52 becomes the beam thickness.

In FIGS. 4A to 4G, the fabrication process of a third example of the prior art is shown. First, an n-type silicon substrate 62 is formed on a p-type silicon substrate 61, and a thermal oxide film 63 is formed on both sides of the laminated substrate (FIG. 4A). After removing the p-type silicon part in the region between the supporting part and the weight part by applying an electrochemical etching from the rear surface side using the thermal oxide film as the etching mask (FIG. 4C), the entire rear surface is covered with a protective film 64 of gold or the like (FIG. 4D), and a gap part is formed by carrying out an anisotropic etching from the front surface side (FIG. 4F). Finally, the sensor is completed by removing the gold protective film 64 (FIG. 4G).

Although several fabrication methods of the prior art semiconductor acceleration sensor have been proposed, these prior art fabrication methods have the following drawbacks. To begin with, in the first example of the prior art fabrication method, the thickness of the beam part varies with the temperature of etchant at the time of etching, the etching time and the stirring condition of the etchant. Furthermore, the etching takes a long time because of the large amount to be etched as much as 200 to 400 μm, so that high accuracy control of the beam thickness is not easy to accomplish.

In the second example of the prior art, as shown in FIG. 3D, since the bottom portion of the V-shaped groove is dug into the p-type silicon substrate, the electrochemical etching in the step shown in FIG. 3E does not proceed beyond the bottom portion of the V-shaped groove. Thus a desired beam thickness cannot be achieved.

Furthermore, in the third example of the prior art, the covering property of the rear surface protective film becomes a matter of concern, where pin holes are generated also in the beam part due to the pin holes in the protective film, giving rise to a drawback that about 40% of units produced are defective.

SUMMARY OF THE INVENTION

It is therefore an object of this invention to provide a method of fabricating semiconductor acceleration sensors which solves the above-mentioned problems and gives a sufficiently high yield.

In a method of fabricating a semiconductor acceleration sensor which consists of a supporting part, a beam part connected to the supporting part and a weight part connected to the beam part, formed of semiconductors, and senses an acceleration by detecting the defelection of the beam part accompanying the displacement of the weight part, the method of fabrication according to this invention is characterized in that it carries out sequentially, a step of forming a first mask for forming the supporting part and the weight part on the rear surface of a first conductivity type silicon substrate by using the first conductivity type silicon substrate having a second conductivity type silicon layer with a thickness of twice or more of a desired thickness of the beam part formed on the front surface of the silicon substrate, a step of removing the portion of the first conductivity type silicon substrate between the supporting part and the weight part by applying an electrolytic etching to the rear surface of the first conductivity type silicon substrate via the first mask, a step of forming a second mask for forming a gap part other than the beam part on the front surface of the second conductivity type silicon layer in the region between the supporting part and the weight part, and a step of opening the gap part by carrying out an etching from the rear surface and the front surface of the second conductivity type silicon layer via the first and the second masks, respectively.

Further, in a method of fabricating a semiconductor acceleration sensor which consists of a supporting part, a beam part connected to the supporting part and a weight part connected to the beam part, formed of semiconductors, and senses an acceleration by detecting the deflection of the beam part generated accompanying the displacement of the weight part, the method of fabrication according to this invention is characterized in that it carries out sequentially, a step of forming a first mask for forming the supporting part, the weight part and a detection part rear surface groove part on the rear surface of a first conductivity type silicon substrate by using the first conductivity type silicon substrate having a second conductivity type silicon layer with a thickness of twice or more of a desired thickness of the beam part formed on the front surface of the silicon substrate, a step of removing the portion between the supporting part and the weight part of the first conductivity type silicon substrate and forming the detection part rear surface groove part by applying an electrolytic etching to the rear surface of the first conductivity type silicon substrate via the first mask, a step of forming a second mask for forming a gap part and an opening part of a V-shaped groove for detection other than the beam part on the front surface of the second conductivity type silicon layer in the region between the supporting part and the weight part, and a step of opening the gap part and forming the V-shaped groove for detection by carrying out an etching from the rear surface and the front surface of the second conductivity type silicon layer via the first and the second masks, respectively.

DESCRIPTION OF THE PREFERRED EMBODIMENTS

Figure 5A:
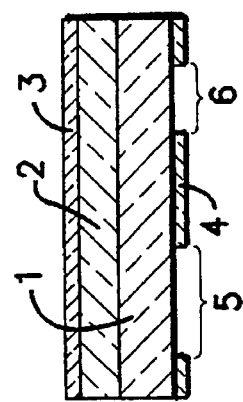
FIGS. 5A to 5D respectively show sectional views of four stages of the fabrication process of the first embodiment of the invention.
Figure 5B:
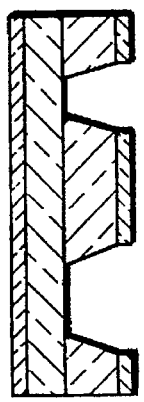
Figure 5C:
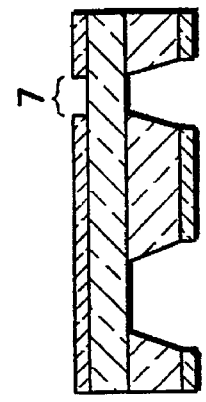
Figure 5D:
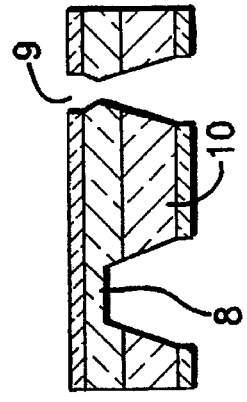

Referring to FIG. 5A, an n-type silicon layer 2 is formed on the top surface of a p-type silicon substrate 1 so as to have a thickness of twice that of a beam part 8 to be formed. Next, an upper protective film 3 and a lower protective film 4 are formed on the top surface of the n-type silicon layer 2 and the bottom surface of the p-type silicon substrate 1, respectively, using a film such as an oxide film or a nitride film, whose etching selectivity ratio with the silicon substrate can be determined. Then, a cavity forming part 5 for the beam part 8 and a lower slit-opening part 6 for gap for forming a weight part 10, the beam part 8 and a gap part 9 in the lower protective film 4 are formed by using photolithography technique. Next, as shown in FIG. 5B, only the n-type silicon layer 2 which has twice the desired thickness of the beam part 8 is left by applying an electrochemical etching to the p-type silicon substrate 1 and stopping the etching at the interface (p-n junction surface) of the p-type silicon substrate 1 and the n-type silicon layer 2. Next, as shown in FIG. 5C, an upper slit-opening part 7 for the gap is formed in the upper protective film 3 by using photolithography technique in order to form the gap part 9. Finally, as shown in FIG. 5D, the gap part 9 is formed by an etching of the n-type silicon layer 2 which proceeds simultaneously in the upper and the lower surfaces at the same etching speed. As for the beam part 8, the etching of the n-type silicon layer 2 proceeds from its lower surface side alone and the beam part 8 will be given the intended thickness when the gap part is opened through. Therefore, by letting light be incident upon the gap part 9 and monitoring the timing of the opening of the slit with an optical sensor it becomes possible to control the thickness of the beam with high accuracy. With the above-mentioned fabrication processes, it becomes possible to omit the process of formation of a protective film for the beam part 8, and eliminate the pin hole defects of the beam part 8.

Figure 6A:
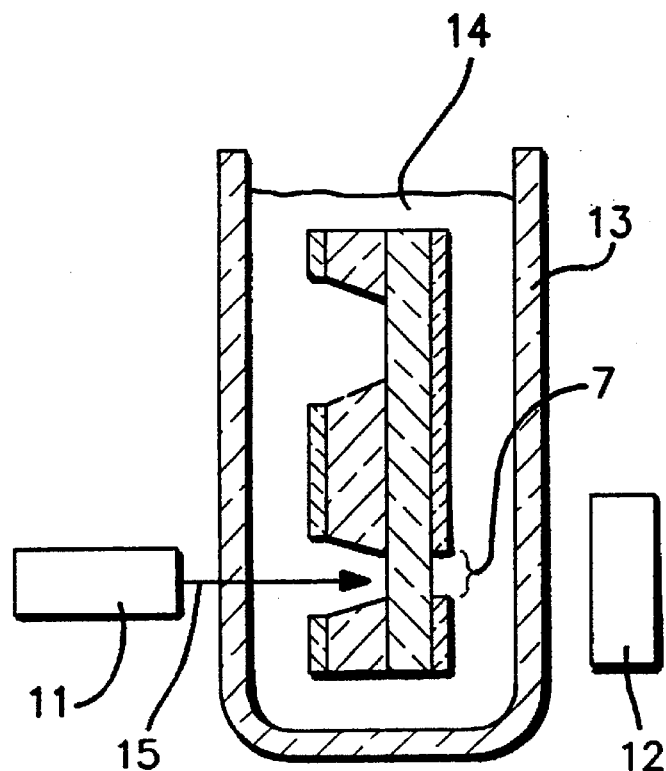
FIGS. 6A and 6B respectively show sectional views of two stages of monitoring the timing of penetration.
Figure 6B:
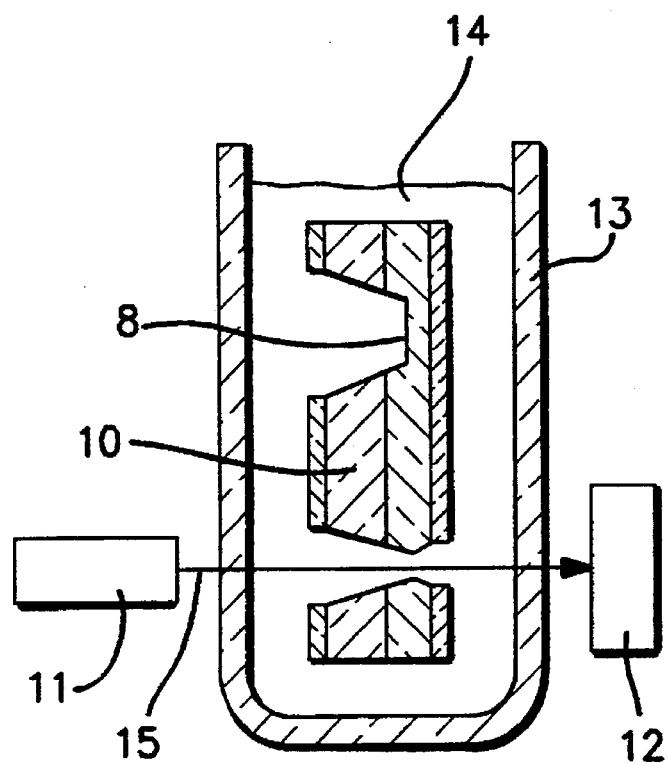

As for the means for detecting the timing of the penetration at the gap part 9, a light source 11 and an optical sensor 12 are arranged outside of an etching solution container 13 so as to be opposed to each other when the container is made of transparent material such as quartz as shown in FIG. 6A. A laser light source is desirable as the light source and its optical axis is arranged so as to pass through the center portion of the gap part 9. When the gap part 9 is penetrated after processing the etching process in an etching solution 14, the laser light 15 is detected by the optical sensor 12, and thus the end time of etching process can be found accurately.

In the first embodiment, although the thickness of the n-type silicon substrate 2 is selected to be just the twice of the desired beam thicknesses, other thickness can be selected by utilizing the known etching phenomenon as follows.

When a silicon substrate having (001) surface is subjected to anisotropic etching through a window having an opening width W, V-shaped groove is formed and its depth d is determined by the equation of d=W×0.7. Accordingly, in order to obtain 10 μm thick beam, the upper opening width should be selected to be 14.3 μm and the etching should be stopped at the time the etching from the rear side has reached to the V-shaped groove. Needless to say, the rear opening width should be wide enough to reach the etching to the V-shaped groove. In this way, since the opening width of the mask determines the etching depth and the V-shaped groove acts as etching end detector, the thickness of the n-type silicon substrate is not restricted to the just the twice the desired beam thickness but can be more than twice, even three times the desired beam thickness. In the case that the n-type silicon substrate has a thickness of three times (30 μm) the desired beam thickness of 10 μm, for example, the mask opening width at rear side of the p-type silicon substrate 1 should be determined such that the opening size at the bottom portion of the n-type silicon substrate 2, after the electrochemical etching for the p-type silicon substrate 1 was finished, becomes more than twice the upper opening width.

In the following embodiment, such etching end detector portion is provided on the n-type silicon substrate which has the thickness of two or more times the desired beam thickness.

Figure 1:
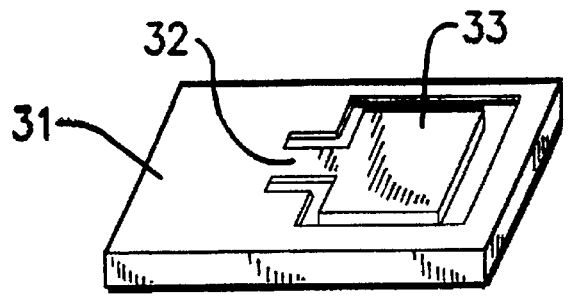
FIG. 1 shows a perspective view of a conventional semiconductor acceleration sensor.
Figure 2A:
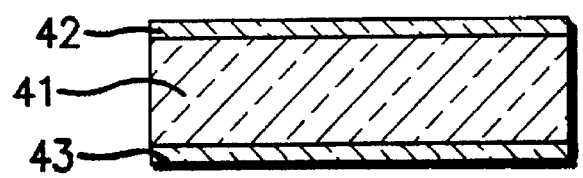
FIGS. 2A to 2D respectively show sectional views of four stages of a conventional fabrication process of the semiconductor acceleration sensor.
Figure 2B:
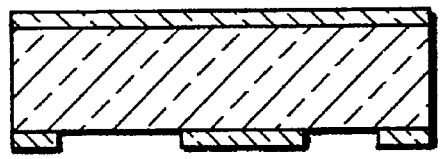
Figure 2C:
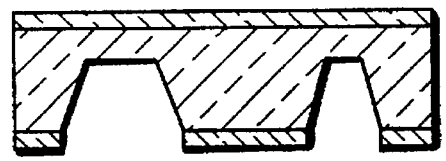
Figure 2D:
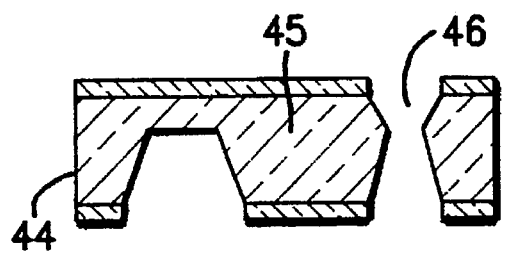
Figure 3A:
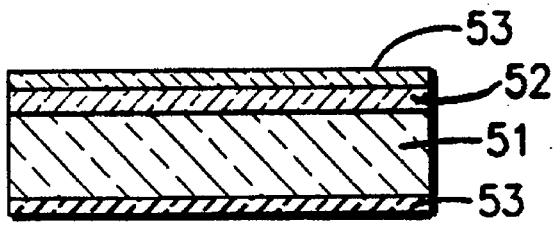
FIGS. 3A to 3F respectively show sectional views of six stages of another conventional fabrication process of the semiconductor acceleration sensor.
Figure 3B:
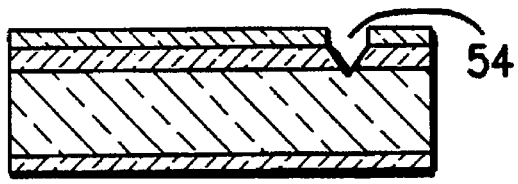
Figure 3C:
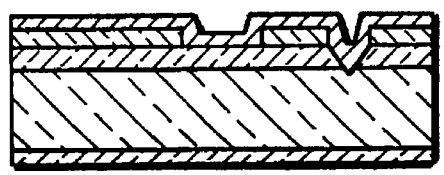
Figure 3D:
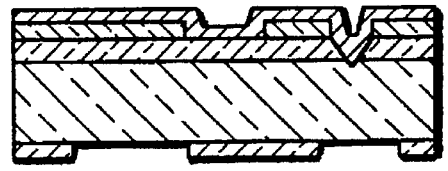
Figure 3E:
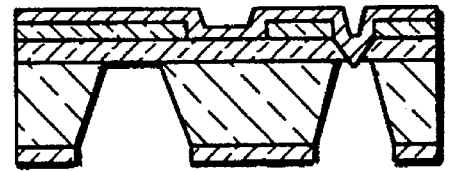
Figure 3F:
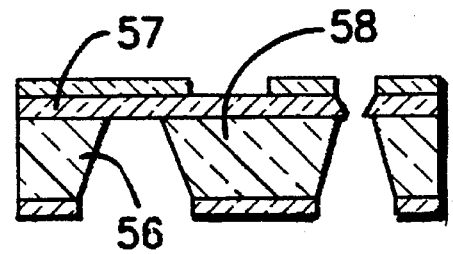
Figure 4A:
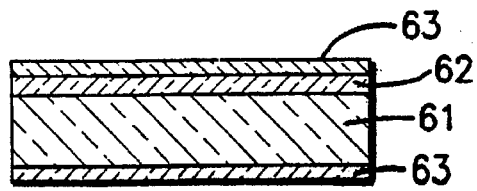
FIGS. 4A to 4G show sectional views of seven stages of still another conventional fabrication process of the semiconductor acceleration sensor.
Figure 4B:
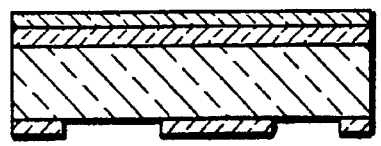
Figure 4C:
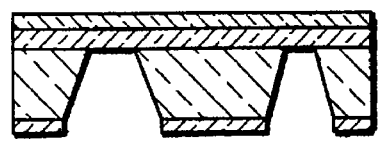
Figure 4D:
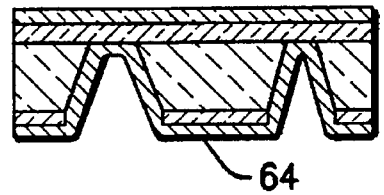
Figure 4E:
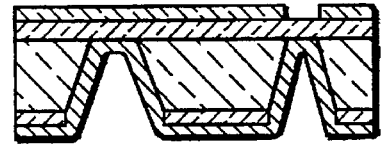
Figure 4F:
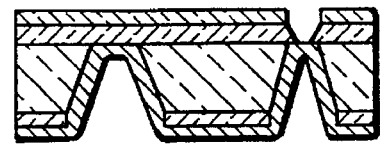
Figure 4G:
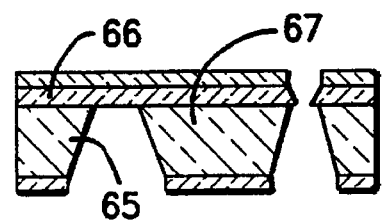
Figure 7A:
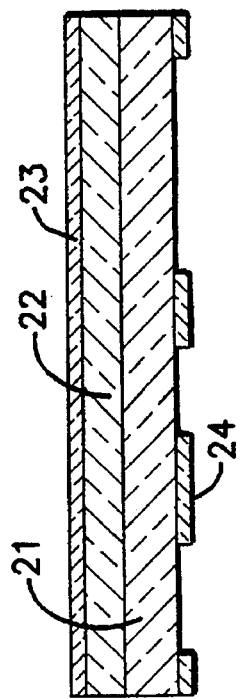
FIGS. 7A to 7D respectively shows sectional views of four stages of the fabrication process of the second embodiment of the invention.
Figure 7B:
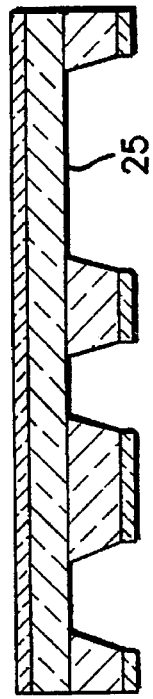
Figure 7C:
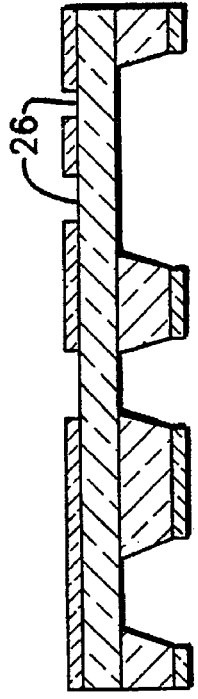
Figure 7D:
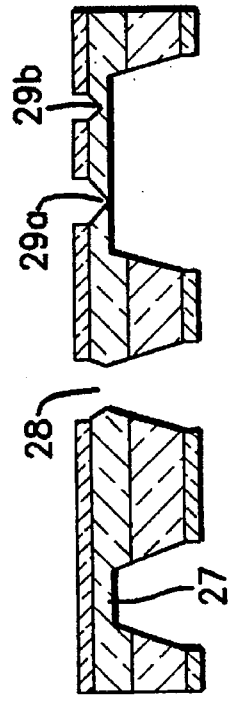

In the second embodiment, an etching end point detection part for beam thickness control is formed in a part of the wafer. First, as shown in FIG. 7A, an n-type silicon layer 22 is formed on the top surface of a p-type silicon substrate 21 so as to have a thickness which is two or more times an intended thickness of a beam part 27. Both of the silicon layer and substrate have (001) surface. Next, as shown in FIG. 7B, parts of the p-type silicon substrate 21 and a detection part rear surface groove part 25 for the etching end point detection part of the sensor chip part are anisotropically etched by using an electrochemical etching. Next, as shown in FIG. 7C, opening parts are formed in the upper protective film 23 by photolithography to form a window opening part for a gap part 28 and detection V-shaped groove opening parts 26. Next, as shown in FIG. 7D, by an anisotropic etching of the n-type silicon layer 22, etching proceeds respectively, simultaneously from the upper surface as well as the lower surface for the gap part 28, from the lower surface alone for the beam part 27 and the detection part rear surface groove part 25, and from the upper surface alone for the V-shaped grooves 29 for detection. Therefore, it is possible to stop the etching at the thickness of the beam part exactly as planned by monitoring the timing at which the detection part rear surface groove part 25 reaches the V-shaped groove 29 for detection and the n-type silicon layer 2 is opened through, by means of an optical sensor or the like. As in the above, the etching end point is determined by the depth of the groove 29 for detection, and its depth is in turn determined by the width of the detection V-shaped groove opening part 26 selected in the step shown in FIG. 7C. Moreover, by forming V-shaped grooves for detection with various depths, it becomes possible to select and form an arbitrary thickness for the beam.

With the fabrication process in the above, it becomes possible to control the beam thickness with high accuracy, and arbitrarily select a beam thickness in as many ways as there are different kinds of V-shaped groove for detecting the end point of etching. Further, even for wafers of different product sizes, the end point detection part can be formed at a location common to these products so that the etching device can be used commonly for all of these wafers.

In addition, even if the order of lamination of the n-type layer and the p-type layer is reversed or the upper layer is one formed by the diffusion process in both the first and the second embodiments, the process described in the above can satisfactorily deal with the situation.

As described in the above, in the method of fabricating a semiconductor acceleration sensor according to this invention, an electrochemical etching is applied by forming a second conductivity type silicon layer having a thickness of two or more times the desired thickness for the beam part on the first conductivity type silicon substrate, so that the etching will still be continued for the beam part concurrently with the etching in the later step for forming the gap part. Accordingly, the need for protecting the etched surface of the beam is no longer required, with a result that it is completely free from generation of pin holes in the beam part which used to occur in the conventional device due to unsatisfactory coverage of the protective film on the rear surface. In addition to the simplification in the fabrication process which can be brought about by this invention, the photolithography process for the formation of the gap part is performed in the state where the thickness of the beam part is two or more of the set value so that breakage of the beam part seldom occurs, which has an advantage that it leads to an improvement in the yield.

Moreover, the detection of the etching end point which has been a problem in the etching by time control becomes possible by monitoring the penetration time of the gap, and the formation of a beam with a highly accurate thickness becomes feasible.

What is claimed is:

1. A method of fabricating a semiconductor acceleration sensor comprising the steps of:

providing a silicon wafer having laminated structure of a first substrate of a first conductivity type silicon and a second substrate of a second conductivity type silicon, said second substrate being provided on a front surface of said first substrate and having a thickness of two or more times a desired thickness of a beam part;

forming a first mask for forming a supporting part and a weight part on a rear surface of said first substrate, said beam part being connected to said supporting part and said weight part;

removing a portion of said first substrate between said supporting part and said weight part by applying an electrochemical etching to said rear surface of said first substrate via said first mask;

stopping the removing step at the interface of said first substrate and said second substrate;

providing an opening in said first mask for etching a gap part;

forming a second mask for etching said gap part away from said beam part on a front surface of said second substrate in a region between said supporting part and said weight part; and opening said gap part by carrying out an etching from a rear surface and said front surface of said wafer via said first and second masks, respectively.

2. A method of fabricating a semiconductor acceleration sensor comprising the steps of:

providing a silicon wafer having laminated structure of a first substrate of a first conductivity type silicon and a second substrate of a second conductivity type silicon, said second substrate being provided on a front surface of said first substrate and having a thickness of two or more times a desired thickness of a beam part;

forming a first mask for forming a supporting part, a weight part and etching end detector region on a rear surface of said first substrate, said beam part being connected to said supporting part and said weight part;

removing a portion of said first substrate between said supporting part and said weight part and a portion of said first substrate corresponding to said detector region by applying an electrochemical etching to said rear surface of said first substrate via said first mask;

stopping the removing step at the interface of said first substrate and said second substrate;

providing openings in said first mask for etching a gap part and a V-shaped groove;

forming a second mask for etching said V-shaped groove and said gap part away from said beam part on a front surface of said second substrate in a region between said supporting part and said weight part;

opening said gap part and said V-shaped groove by carrying out a second etching from a rear surface and said front surface of said wafer via said first and second masks, respectively; and stopping said second etching by detecting that said V-shaped groove is opened through.

3. A method of fabricating a semiconductor acceleration sensor according to claim 2, wherein said second mask has a first opening window for said V-shaped groove and a second opening window for said gap part, and a width of said second opening window is larger than that of said first opening window.

4. A method of fabricating a semiconductor acceleration sensor according to claim 2, wherein said detecting means comprises a light source and an optical sensor.

5. A method of fabricating a semiconductor acceleration sensor according to claim 2, wherein each of said first and second substrates has (001) surface.

* * * * *